United States Patent
Svajda

(10) Patent No.: US 11,743,667 B2
(45) Date of Patent: *Aug. 29, 2023

(54) DISCRIMINATION OF LIGHT INTERFERENCE IN A MEMS MICROPHONE

(71) Applicant: InvenSense, Inc., San Jose, CA (US)

(72) Inventor: Miroslav Svajda, San Jose, CA (US)

(73) Assignee: InvenSense, Inc., San Jose, CA (US)

( * ) Notice: Subject to any disclaimer, the term of this patent is extended or adjusted under 35 U.S.C. 154(b) by 0 days.

This patent is subject to a terminal disclaimer.

(21) Appl. No.: 17/898,352

(22) Filed: Aug. 29, 2022

(65) Prior Publication Data

US 2022/0417685 A1    Dec. 29, 2022

Related U.S. Application Data

(63) Continuation of application No. 17/174,890, filed on Feb. 12, 2021, now Pat. No. 11,463,830.

(51) Int. Cl.
*H04R 29/00* (2006.01)
*H03F 3/183* (2006.01)
(Continued)

(52) U.S. Cl.
CPC .......... *H04R 29/004* (2013.01); *H03F 3/183* (2013.01); *H04R 1/04* (2013.01); *H04R 3/00* (2013.01);
(Continued)

(58) Field of Classification Search
CPC .......... H04R 29/004; H04R 1/04; H04R 3/00; H04R 7/04; H04R 19/04; H04R 2201/003; H03F 3/183; H03F 2200/03
(Continued)

(56) References Cited

U.S. PATENT DOCUMENTS

| | | |
|---|---|---|
| 9,008,629 B1 | 4/2015 | Masterman |
| 10,484,799 B1 | 11/2019 | Ye |

(Continued)

FOREIGN PATENT DOCUMENTS

| | | |
|---|---|---|
| CN | 110650418 A | 1/2020 |
| CN | 21049119 * | 5/2020 |

(Continued)

OTHER PUBLICATIONS

International Search Report and Written Opinion received for PCT Patent Application No. PCT/US2022/012917, dated May 10, 2022, 14 pages.

(Continued)

*Primary Examiner* — William A Jerez Lora
(74) *Attorney, Agent, or Firm* — Van Hoven PC; Joshua Van Hoven

(57) ABSTRACT

A microelectromechanical system (MEMS) microphone includes a cavity to receive an acoustic signal. The acoustic signal causes movement of a diaphragm relative to one or more other surfaces, which in turn results in an electrical signal representative of the received acoustic signal. A light sensor is included within the packaging of the MEMS microphone such that an output of the light sensor is representative of a light signal received with the acoustic signal. The output of the light sensor is used to modify the electrical signal representative of the received acoustic signal in a manner that limits light interference with an acoustical output signal.

20 Claims, 10 Drawing Sheets

(51) Int. Cl.
*H04R 1/04* (2006.01)
*H04R 3/00* (2006.01)
*H04R 7/04* (2006.01)
*H04R 19/04* (2006.01)

(52) U.S. Cl.
CPC ............... *H04R 7/04* (2013.01); *H04R 19/04* (2013.01); *H03F 2200/03* (2013.01); *H04R 2201/003* (2013.01)

(58) Field of Classification Search
USPC ........................ 381/56, 58, 91, 122, 124, 172
See application file for complete search history.

(56) References Cited

U.S. PATENT DOCUMENTS

2003/0016838 A1  1/2003  Paritsky et al.
2013/0128487 A1*  5/2013  Lo ........................... H05K 3/30
                                                          361/813
2020/0342075 A1* 10/2020  Nethery ................ G06F 21/629
2020/0394886 A1* 12/2020  Antar .................... H04N 7/188

FOREIGN PATENT DOCUMENTS

CN    210491199 U       5/2020
CN    111654794 A       9/2020
WO    2018/134568 A1    7/2018

OTHER PUBLICATIONS

Sugawara et al., "Light Commands: Laser-Based Audio Injection Attacks on Voice-Controllable Systems", arxiv.org, Jun. 22, 2020, pp. 1-19.

* cited by examiner

US 11,743,667 B2

DISCRIMINATION OF LIGHT INTERFERENCE IN A MEMS MICROPHONE

CROSS-REFERENCE TO RELATED APPLICATIONS

The present application is a continuation of U.S. application Ser. No. 17/174,890, filed Feb. 12, 2021, and entitled "DISCRIMINATION OF LIGHT INTERFERENCE IN A MEMS MICROPHONE," all of which is hereby incorporated by reference herein in its entirety.

BACKGROUND

Mobile and smart devices are proliferating to ever more environments, enabling scores of applications such as virtual assistants, home automation, and vehicular controls. One user input modality that is gaining increased usage is voice input. Systems such as digital assistants are increasingly able to recognize particular users (e.g., by voice, pitch, etc.) and to understand and process increasingly complex commands. Because voice control is "hands free," it is often the most convenient way to provide such input. Accordingly, miniaturized microphones such as microelectromechanical system (MEMS) microphones have proliferated to a wide variety of "smart" devices such as computers, phones, watches, locks, appliances, wireless earbuds, augmented reality systems and the like. As voice control applications become more commonplace, these systems are increasingly performing critical functions such as controlling access to a secured location or operating equipment.

It is therefore important that components such as MEMS microphones accurately capture and process received acoustic signals such as voice commands. Such acoustic signals are typically received via a partially exposed access port to the external environment, such as an exposed cavity that receives an acoustic signal and provides a path for the acoustic signal to be received by a movable diaphragm that responds to the acoustic signal. This access port is also at least partially exposed to other aspects of the external environment. One such aspect that may impact microphone performance is light energy. Given the small size and microscopic movements of typical microphones, a light source applied to the microphone may generate electrical signals (e.g., based on energy created by the photons of the light energy) that in some instances may interfere with the electrical representation of the acoustic signals. In some instances such as targeted use of lasers, light may even be modulated to "simulate" an acoustic signal, resulting in false commands or providing a mechanism for hackers to gain access to critical device functionalities.

SUMMARY

In an embodiment of the present disclosure, a microelectromechanical system (MEMS) microphone package comprises a MEMS layer that includes a MEMS diaphragm movable in response to a received acoustic signal, a light sensor at a location on an exposed surface of the MEMS microphone package and configured to output a light signal based on light received at the location, and processing circuitry coupled to the MEMS layer and the light sensor. The processing circuitry is configured to output a microphone signal corresponding to movement of the MEMS diaphragm in response to the received acoustic signal, and wherein the microphone signal is modified based on the light signal.

In an embodiment of the present disclosure, a system comprises a microelectromechanical system (MEMS) microphone package that includes a MEMS layer. The MEMS layer comprises a MEMS diaphragm movable in response to a received acoustic signal, a light sensor at a location on an exposed surface of the MEMS microphone package and configured to output a light signal based on light received at the location, and processing circuitry coupled to the MEMS layer and the light sensor. The processing circuitry is configured to output a microphone signal corresponding to movement of the MEMS diaphragm in response to the received acoustic signal, and output a light output signal corresponding to the light signal.

In an embodiment of the present disclosure, a method for modifying the operation of a microelectromechanical system (MEMS) microphone based on a received light signal comprises receiving, at a MEMS diaphragm of the MEMS microphone, a received acoustic signal, and generating, by a capacitor including the MEMS diaphragm, a signal representative of movement of the MEMS diaphragm in response to the received acoustic signal. The method may further comprise receiving light at a light sensor at a location on an exposed surface of the MEMS microphone, and generating, by the light sensor, a light signal based on light received at the location. The method may further comprise receiving, by processing circuitry of the MEMS microphone, the signal representative of movement of the MEMS diaphragm and the light signal, and generating, by the processing circuitry, a microphone signal based on the signal representative of movement of the MEMS diaphragm and the light signal.

BRIEF DESCRIPTION OF DRAWINGS

The above and other features of the present disclosure, its nature, and various advantages will be more apparent upon consideration of the following detailed description, taken in conjunction with the accompanying drawings in which.

DETAILED DESCRIPTION OF DRAWINGS

Figure 1:
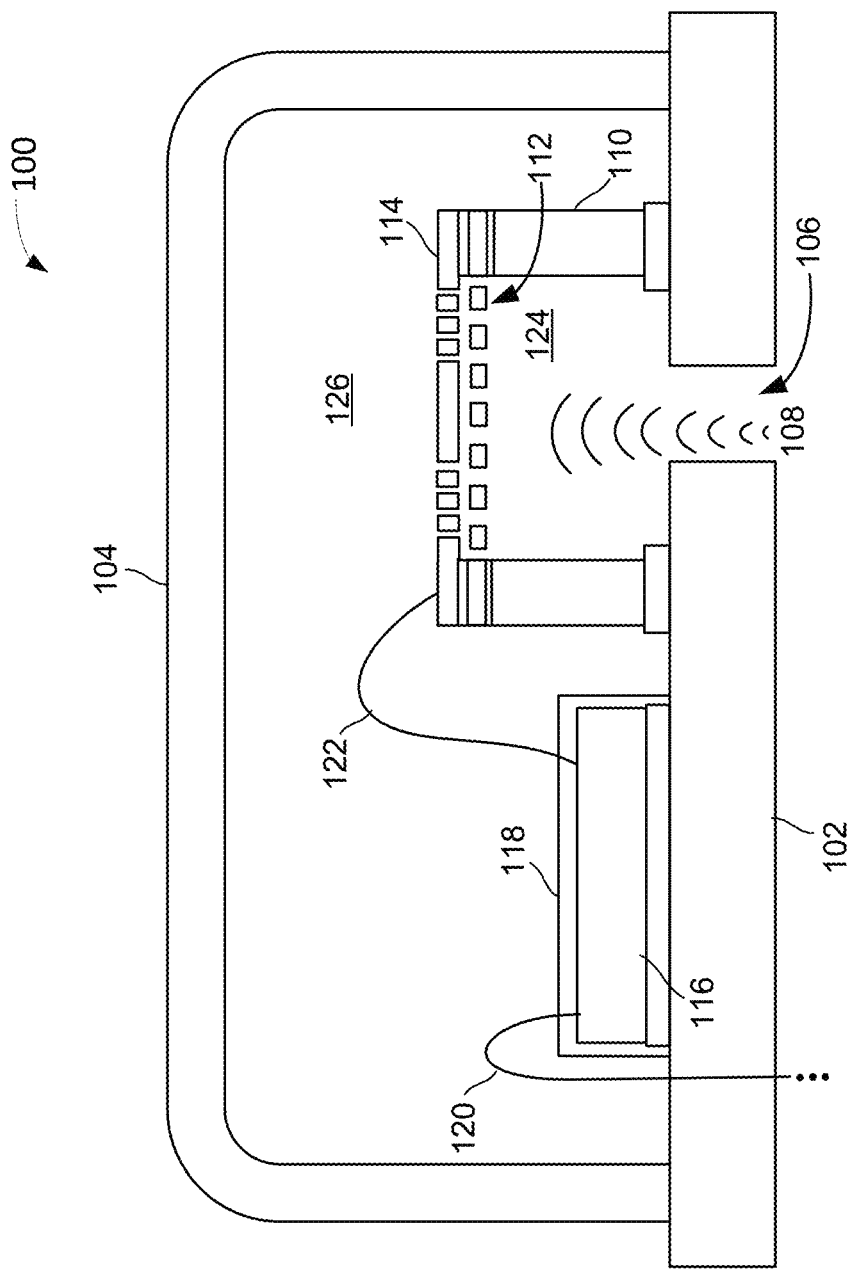
FIG. 1 shows an illustrative MEMS microphone package in accordance with an embodiment of the present disclosure.

A miniaturized microphone is partially exposed to the external environment such that one or more front cavities of the microphone is exposed to receive an acoustic signal such as human speech and voice commands. The acoustic signal interacts with one more components of the miniaturized microphone (e.g., MEMS components, piezoelectric components, etc.) such that an electrical representation of the acoustic signal is generated and processed to output a microphone signal that is an electrical (e.g., analog and/or digital) representation of the received acoustic signal that can be used by other components (e.g., a host processor) to perform functions such as audio capture, speech recognition, and voice commands. In an example of a MEMS microphone, a diaphragm may be exposed to the front cavity and be designed such that it moves in response to the acoustic signal. The movement of the diaphragm relative to a generally fixed surface such as a back plate may be sensed such as by capacitive signal, and the resulting capacitive signal may be processed to generate an output signal such as a microphone signal. The processing may be performed in whole or in part by processing circuitry that is integral to the MEMS microphone, such as an application specific integrated circuit (ASIC) at least partially located within a back cavity of the MEMS microphone.

External interference sources such as light may also be received via the partially exposed portions of the MEMS microphone, such that the light is also received within the front cavity of the MEM microphone. The light may also propagate to other portions of the MEMS microphone, including via voids of the diaphragm (e.g., for shaping and suspending the diaphragm) and back plate (e.g., equalization channels that allow pressure to equalize between the front and back cavities) to the back cavity. The light may further reflect within the back cavity, propagating to components such as the processing circuitry of the MEMS microphone. Depending on the frequency, intensity, duration, pattern, and other similar variables, the light energy may generate noise that degrades the accuracy of the output microphone signal's representation of the received acoustic signal. Light may be absorbed in the components of the MEMS microphone and converted into electrical signal, which interferes with the received acoustic signal (e.g., photons and/or generated heat changing the movement of the MEMS components, or acoustic properties of the front and/or back cavity, and photons creating electron-hole pairs in the semiconductor material of the ASIC and the resulting electrical signal interfering with internal circuits in the ASIC such as amplifiers, bias generators, oscillators, comparators, analog-digital converters, and the like).

One or more light sensors may be located at a variety of locations on or near the MEMS microphone, such as at other components (e.g., circuit boards, enclosures, etc.) affixed to the MEMS microphone, on an external surface of the MEMS microphone, within the front or back cavity of the MEMS microphone, on or near the capacitive sensing components of the MEMS microphone (e.g., the diaphragm and/or back plate), and proximate to or as components of the MEMS microphone processing circuitry. The outputs of the light sensors may be received and processed in a manner such that they can be associated with the microphone signal generated while the light energy is received. For example, the processing circuitry of the MEMS microphone receives and processes the light signal outputs of the light sensors such that the light signals are amplified and filtered to be scaled appropriately for use with the microphone signal, and are synchronized (e.g., as time-associated digital data) to the received microphone signal.

The processing circuitry may perform a variety of operations based on the light signal outputs of the light sensors. The light signals may be analyzed to identify conditions that correspond to likely errors (e.g., due to a likely unacceptable amount of light-induced noise, as measured by an absolute, time-averaged or root mean square threshold), that require different compensation techniques and alerts (e.g., modifying a confidence level or speech processing algorithm, or providing notifications for other processing components such as a host processor), or that correspond to potential device attacks (e.g., based on correlation or other pattern matching technique with known attack vectors). Compensation of the microphone signal may also be performed based on the measured light signals to remove the effect of the light signal in post processing and/or to modify the operation of the MEMS components or processing circuitry, such as modifying bias voltages or currents, temporarily reducing MEMS sensor sensitivity, and modifying acoustical signal path gain or frequency-response scaling factors. Compensation may also be performed dynamically based on associations between light signals and microphone signals (e.g., correlation). Compensation parameters may be determined for a particular MEMS microphone based on testing during manufacturing or assembly, and/or may be determined over time based on real-world associations between light signals and microphone signals.

FIG. 1 shows an illustrative MEMS microphone package in accordance with an embodiment of the present disclosure. In the depicted embodiment, the microphone package has a particular configuration, including the number and location of MEMS microphone structures and access ports, diaphragm and back plate design, configuration and volume of front and back cavities, cover shape, and processing circuitry type and location. It will be understood that the present invention is applicable to any suitable microphone type and configuration, including modifications to any of the above or other features such as multiple MEMS microphone structures, different front and back cavity designs, varied locations and types of processing circuitry, and additional circuitry such as additional processing circuitry (e.g., a host processor coupled to the processing circuitry of the MEMS microphone package.

An exemplary MEMS microphone package 100 includes a cover 104 affixed to a substrate 102, which collectively define an internal volume of the MEMS microphone 100 in which the MEMS handle structure 110 (e.g., including diaphragm 112 and back plate 114) are located and that includes the front cavity 124 and back cavity 126. Although not depicted in the section view of FIG. 1, the cover 104 and substrate 102 may be generally square or rectangular, while an access port 106 extending through substrate 102 to front cavity 124 may be generally circular.

A MEMS handle structure 110 may include an internal volume that defines the front cavity 124, with a front cavity designed to have appropriate properties for receiving and propagating an acoustic signal 108 that is received via the access port 106. A MEMS diaphragm 112 is located at a location of the MEMS handle structure 110 opposite the access port 106, such that acoustical energy of an acoustic signal 108 within front cavity 124 propagates to the MEMS diaphragm 112. The MEMS diaphragm 112 is fabricated as a relatively thin layer of material, is suspended by springs, and has a shape that collectively facilitates movement of the MEMS diaphragm 112 in response to the acoustic signal 108. Back plate 114 is located parallel to MEMS diaphragm 112 and is fabricated as a relatively thick layer of material that does not appreciably move in response to the received acoustic signal 108. Back plate 114 also includes equalization channels that allow pressure to equalize between the front cavity 124 and back cavity 126. In some embodiments (not depicted), the back plate 114 is positioned such that the acoustic signal first contacts the backplate before contacting the diaphragm 112. Collectively, the design and configuration of the MEMS diaphragm 112, back plate 114, front cavity 124, and back cavity 126 influence the response of the MEMS diaphragm 112 to the acoustic signal 108.

The MEMS diaphragm 112 and back plate 114 are each at a respective potential (e.g., based on electrical connections to processing circuitry 116 via substrate 102, not depicted) such that a capacitance is formed between the MEMS diaphragm 112 and back plate 114. The MEMS diaphragm 112 moves relative to the back plate 114 based on the received acoustic signal 108, resulting in a change in capacitance between the MEMS diaphragm 112 and back plate 114 that is representative of the received acoustic signal 108. The sensed capacitance is provided to processing circuitry 116 via an electrical connection 112.

Although processing circuitry 116 may be located in a variety of locations, such as within a substrate 102 of MEMS microphone package 100 or external to MEMS microphone package 100, as depicted in FIG. 1 the processing circuitry 116 is located on the substrate 102 within the back cavity 126. The processing circuitry 116 may include one or more components providing necessary processing based on the requirements of the motion processing system 100. In some embodiments, processing circuitry 116 may be an ASIC specifically designed and/or programmed for microphone processing. In some embodiments, the processing circuitry 116 may include one or more registers that allow aspects of the operation of hardware control logic of the ASIC to be modified (e.g., by modifying a value of a register). In some embodiments, processing circuitry 116 may also include a processor such as a microprocessor that executes software instructions, e.g., that are stored in a local memory (not depicted). The microprocessor may control the operation of the MEMS microphone interacting with the hardware control logic.

Shielding 118 may be formed around processing circuitry 116 to protect the processing circuitry 116 from the light, humidity and other external environment, limit electromagnetic interference, and the like. The processing circuitry 116 performs a variety of functions such as control of MEMS operational parameters, microphone signal processing (e.g., amplification, tuning, filtering, analog-to-digital conversion, and compensation, including based on received light signals as described herein), communication with external components and/or processing (e.g., with a host processor via electrical connection 120), self-test and calibration (e.g., based on received light signals, as described herein), and low-power controls. A signal received at processing circuitry 116 via electrical connection 122 corresponds to a change in capacitance between the MEMS diaphragm 112 and backplate 114, which in turn corresponds to the received acoustic signal 108. That received signal is then processed by the processing circuitry 116 to generate a microphone signal (e.g., a digital representation of the received capacitance) which may be provided to external components for further processing and/or processed further by the processing circuitry (e.g., to remove effects of a light signal on the microphone signal, as described herein).

Figure 2:
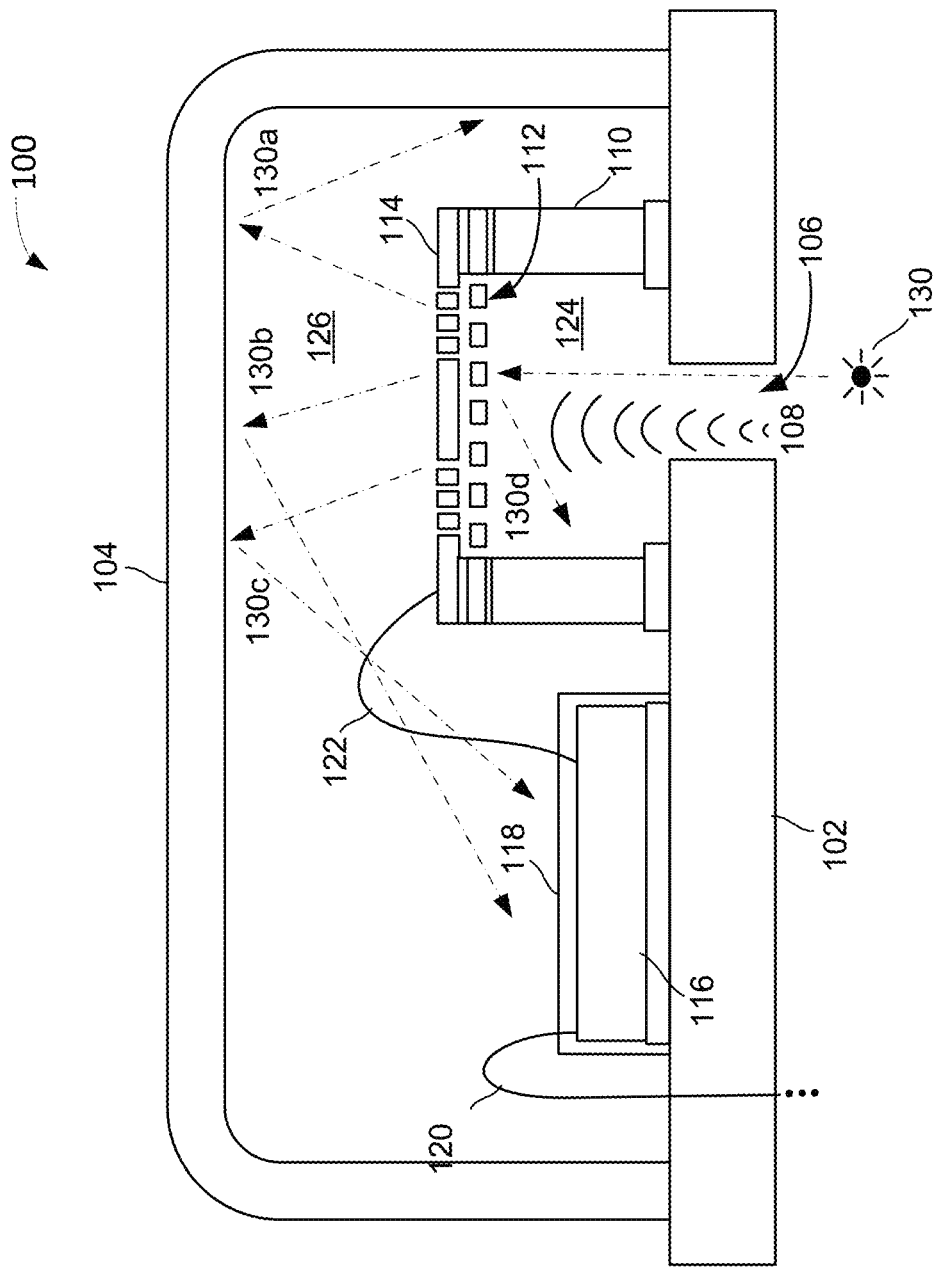
FIG. 2 shows an illustrative MEMS microphone package receiving light interference in accordance with an embodiment of the present disclosure.

FIG. 2 shows an illustrative MEMS microphone package receiving light interference in accordance with an embodiment of the present disclosure. The components of the MEMS microphone package 100 of FIG. 1 are depicted in FIG. 2, except that a light interference source 130 transmits light energy through the access port 106 into the front cavity 124 of the MEMS microphone package 100.

A variety of light interference sources 130 may transmit light energy to the MEMS microphone package 100, including to the exterior of the MEMS microphone package 100 (e.g., substrate 102 or a surface connected or adjacent to substrate 102) and/or interior of the MEMS microphone package 100 (e.g., through access port 106 into front cavity 124). Light interference sources 130 can be provided from natural sources (e.g., sunlight, moonlight, fire, etc.), artificial sources under normal operation (e.g., indoor lighting, outdoor lighting, vehicle headlights, screens, signs, etc.), and targeted sources (e.g., lasers, directed light energy, etc.), and combinations thereof. If a user is relatively stationary, a light interference source may increase MEMS microphone noise over time, such as by increasing the temperature of the MEMS component and/or processing circuitry. Another exemplary light interference source is changes in light reception while a user of the MEMS microphone is moving. For example, a user may be speaking into a microphone while walking, biking, driving, or on public transportation. The user may move between light sources such as by moving between rooms of from in indoor to outdoor environment, or may pass by objects such as trees, buildings, vehicle lights, and signs that temporarily change or obstruct light reaching the MEMS microphone. Such time-varying changes in ambient light irradiation of the MEMS microphone may cause an audible noise at output of the microphone. Abrupt changes in light energy received by the MEMS microphone may abruptly change the noise level to a degree that a received acoustic signal may be obscured. An example of a targeted source is a laser or similar directed light device. Such sources can be electronically controlled to change intensity, wavelength, and other properties at high frequencies, including at frequencies typically associated with acoustic signals to mimic valid or expected user inputs. In this manner, targeted sources can interfere with actual speech and/or be used to mimic speech or voice commands.

The light interference source 130 of FIG. 2 is depicted as a targeted light source, and will be depicted and described as having a particular propagation pattern. It will be understood that while other light interference sources 130 (not depicted) may be received in a different manner (e.g., as dispersed sunlight or artificial light rather than a concentrated targeted light source), such light sources will also propagate within the front cavity, MEMS handle structures, and back cavity as the light energy of the light interference source reflects off of surfaces of the MEMS microphone package. Accordingly, the particular light interference source 130 propagation depicted in FIG. 2 into light interference 130a, 130b, 130c, and 130d is exemplary only. In the exemplary embodiment of FIG. 2, light energy from the light interference source 130 hits surfaces of the MEMS handle structure 110 (e.g., MEMS diaphragm 112 and/or other surfaces defining the front cavity 124), with some of the light energy being absorbed by the components of the MEMS handle structure 110 while some of the light energy is reflected (e.g., as light interference 130d) within the front cavity 124, until all of the light energy is either transmitted away from the front cavity volume (e.g., through to the back cavity 126 and our back out of the access port 106). Some of the light energy from light interference source 130 may also propagate through the MEMS handle structure 110 (e.g., through openings defining the diaphragm structure of the MEMS diaphragm 112 and equalization channels of the back plate 114) to the back cavity 126. The light interference 130a/130b/130c) may continue to propagate within the back cavity, including reflecting off of lid 104. At least some of the light energy from the light interference source 130 may propagate within the back cavity 126 to the processing circuitry 116 (e.g., as light interference 130a, 130b, and/or 130c).

Figure 3:
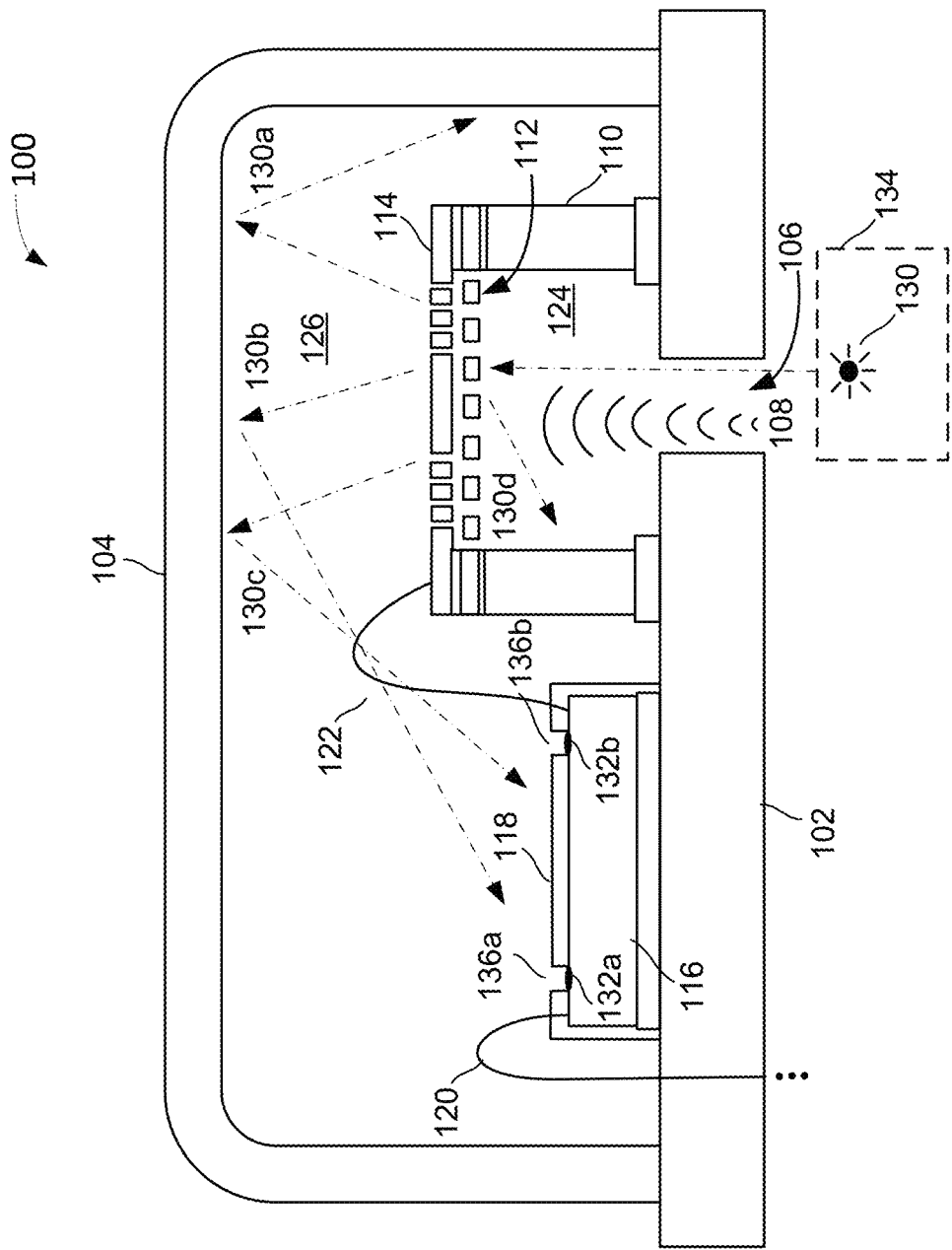
FIG. 3 shows an illustrative MEMS microphone package including a light sensor located at processing circuitry of the MEMS microphone in accordance with an embodiment of the present disclosure.

FIG. 3 shows an illustrative MEMS microphone package including a light sensor located at processing circuitry of the MEMS microphone in accordance with an embodiment of the present disclosure. The components of the MEMS microphone package 100 of FIG. 1 are depicted in FIG. 3, as is the light interference source 130 and propagating light interference 130a/130b/130c/130d of FIG. 2. As depicted in FIG. 3, processing circuitry 116 includes a plurality of light sensors 132a and 132b located at respective locations on an upper surface of processing circuitry that are likely to receive light energy from light interference source 130. Although it will be understood that a variety of light sensors may be used depending on location and application, examples of such light sensors include a photodiode or a phototransistor. An exemplary photodiode can be realized in the same semiconductor technology as the processing circuitry 116 by means of available active components (e.g. junction diodes). Although in the exemplary embodiment of FIG. 3, two light sensors 132a and 132b are depicted at respective locations on the upper surface of the processing circuitry 116, it will be understood that fewer (e.g., zero, one) or more (e.g., 2, 4, 8, 16) light sensors may be located at a variety of potentially exposed surfaces of the processing circuitry 116, including on side surfaces. The light sensors 132a and 132b are exposed to the light interference by gaps 136a and 136b in the shielding 118 of the processing circuitry, although in some embodiments (not depicted) the light sensors may extend outwards from the processing circuitry 116 such that they extend beyond the shielding 118. One or more light sensors could be located under the shielding 118 and used a reference to compensate for offset or other non-idealities of the light sensor or it's processing circuitry 116.

The placement and dispersal of the light sensors 132a/132b may be selected to optimize the acquisition of relevant data regarding light interference sources 130. For example, light sensors 132 (e.g., light sensors 132a/132b) may be distributed over the upper surface of the processing circuitry to capture information about relative light reception at different locations of the processing circuitry. Such a distribution may provide more accurate information regarding the total light energy absorbed by the processing circuitry 116, for example, if received light energy is more concentrated at particular locations of the processing circuitry 116. In addition to determining total light received, compensation of a microphone signal may be selected based on which particular components of the processing circuitry are receiving light energy, and utilizing compensation techniques targeted to those components. In addition, and as described herein, light sensors may also be located at additional locations of the MEMS microphone package and/or other locations relative to the MEMS microphone package (e.g., on a board or other surface adjacent to the access port 106).

In some embodiments, a light interference source 130 may be a test source 134. Test source 134 may be any suitable system that provides a simulated or other test light interference signal to the MEMS microphone. As an example, a test source may include a laser or artificial light source that is cycled through predetermined patterns of intensity, wavelength, and other relevant parameters. The test source 134 applies the known light interference pattern to the MEMS microphone package 100 while the processing circuitry measures and processes outputs from the light sensors and active MEMS components to generate time-associated light signals and microphone signals. The test pattern provided by the test source 134 is associated with the light sensor signal and the microphone signal to establish compensation values, warning thresholds, and other relevant parameters. In some embodiments, compensation parameters may be tested in real time, for example, to identify compensation parameters such that a microphone signal determined prior to application of light from the light source closely matches a microphone signal (e.g., as modified based on the determined light signal) determined while the light interference is applied. In some embodiments, the test source may not directly apply the light but may measure external light conditions (e.g., in an outdoor environment) that may be associated with microphone signals and light signals determined by the processing circuitry 116, for establishing compensation values, warning thresholds, and other relevant parameters. The test pattern may also be used for optical communication with the microphone and contain pre-determined commands, which are interpreted by the microphone.

Although the embodiment of FIG. 3 has been described in the context of processing circuitry 116 (e.g., an ASIC) located within a back cavity 126 of the MEMS microphone package, in some embodiments the processing circuitry 116 could be entirely or partially located elsewhere, such as entirely or partially integrated into the substrate 102 (e.g., as a CMOS substrate layer). Such configurations (not depicted in FIG. 3) allow a light sensor 132 of the processing circuitry to be located at additional relevant positions for monitoring for light interference, such as on the outward-facing surface of substrate 102 (e.g., similar to light sensor 132c in FIG. 4), on the outward facing surface of the access port 106 of substrate 102 (e.g., similar to light sensor 132d in FIG. 4), or partially extending into the front cavity (e.g., partially extending into access port 106 from substrate 102).

Figure 4:
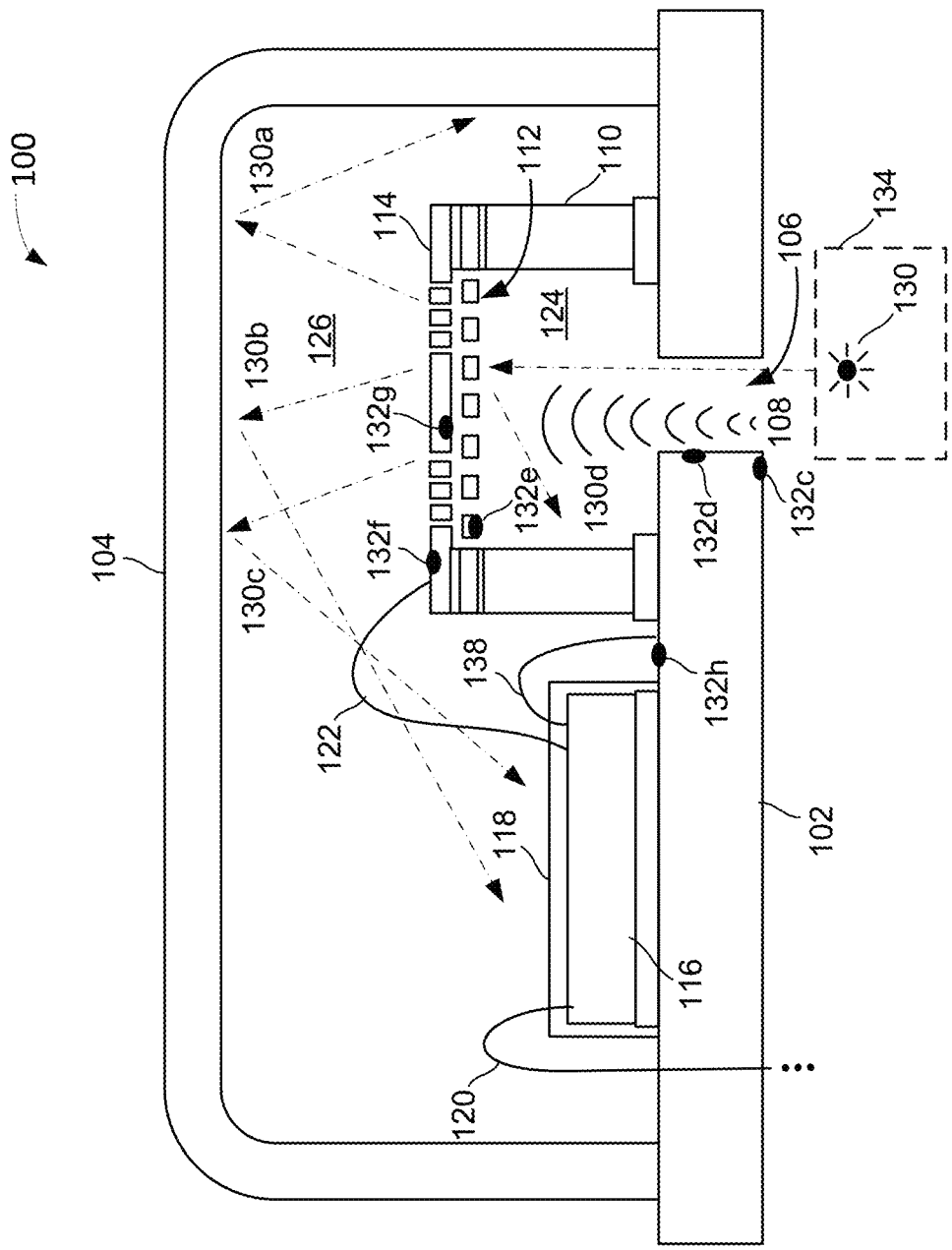
FIG. 4 shows an illustrative MEMS microphone package including a light sensor located at multiple locations of the MEMS microphone in accordance with an embodiment of the present disclosure.

FIG. 4 shows an illustrative MEMS microphone package including a light sensor located at multiple locations of the MEMS microphone in accordance with an embodiment of the present disclosure. The components of the MEMS microphone package 100 of FIG. 1 are depicted in FIG. 4, as is the light interference source 130 and propagating light interference 130a/130b/130c/130d of FIG. 2, and test source 134 of FIG. 3. In the embodiment of FIG. 4, additional light sensors 132c/132d/132e/132f/132g/132h are shown at a number of additional locations outside of the processing circuitry 116 within the MEMS microphone package 100. While a particular subset of light sensors is shown in particular locations on particular components in FIG. 4, it will be understood that light sensors may be located at similar locations on the same components (e.g., at different locations of the MEMS diaphragm 112 for light sensor 132e, at different locations of access port 106 for light sensor 132d, etc.), on other components (e.g., at lid 104 or another portion of MEMS handle structure 110), or external to the MEMS microphone package 100 (e.g., on a circuit board or other adjacent surface). Moreover, multiple light sensors 132 may be located on such components, and light sensors 132 external to the processing circuitry 116 may be combined with light sensors of processing circuitry 116. In this manner, light sensors 132 may capture information about light interference sources 130 at a variety of locations as the light energy propagates through the MEMS microphone package 100.

Lights sensors 132c/132d/132e/132f/132g/132h are each located separate from the processing circuitry 116. Accordingly, it is necessary to provide an electrical connection from light sensors 132c/132d/132e/132f/132g/132h to processing circuitry 116 and or other processing circuitry (e.g., of a host processor). For example, light sensors 132e, 132f, and 132g may provide output signals to processing circuitry 116 via an electrical connection such as electrical connection 122. As another example, light sensors 132c, 132d, and 132h may provide output signals to processing circuitry 116 via an electrical path through substrate 102.

Light sensor 132c may be located on a lower exposed surface of substrate 102 adjacent to access port, such that it receives light energy directly from light interference source 130 as it enters the access port 106. Light sensor 132d may be located within on an interior surface of access port 106, and may be more likely to receive light energy from reflections within the access port 106 and/or more dispersed light sources. Comparisons of output signals from light sensor 132c and light sensor 132d may provide information useful for characterizing the light interference source 130, such as whether the light interference source 130 is a directed light source (e.g., based on a relatively large difference between readings at light sensors 132c and 132d).

Light sensors 132e, 132f, and 132g may be located at respective locations within the MEMS handle structure 110, such as light sensor 132e located at a lower-facing surface (e.g. in the direction of the front cavity 124) of the MEMS diaphragm 112, light sensor 132f located on an upper-facing surface (e.g., in the direction of the back cavity 126) of back plate 114, and light sensor 132g located at a lower-facing surface (e.g., in the direction of the MEMS diaphragm 112 and front cavity 124) of the back plate 114. Comparisons of output signals from light sensors 132e, 132f, and 132g may provide information useful for characterizing the light interference source 130 and/or the light transmission properties of a particular MEMS handle structure 110 design. For example, comparative measurements between these sensors (including, with measurements from other light sensors 132a/132b/132c/132d) may be representative of how particular light interference sources 130 propagate for a particular MEMS handle structure design, for example, based on how much light received within the front cavity 124 (e.g., at light sensors 132c, 132d, and/or 132e) propagates through the MEMS diaphragm 112 to the back plate 114 (e.g., as measured at light sensor 132g) and through the back plate 114 into the back cavity 126 (e.g., as measured at light sensor 132a, 132b, and/or 132c). Placing additional light sensors (e.g., laterally on MEMS diaphragm 112) may provide additional information useful for identifying light energy propagation, and developing associated compensation techniques.

Light sensor 132h may be located on an upper exposed surface of substrate 102 at a location adjacent to the MEMS handle structure 110 and/or processing circuitry 116, such that it receives light energy that has propagated through the MEMS diaphragm 112 and back plate 114, and depending on location, reflected off other components such as cover 104. Comparisons of output signals from light sensor 132h and any of the other light sensor signals may provide information for analyzing the overall propagation pattern of the light interference source 130.

Figure 5:
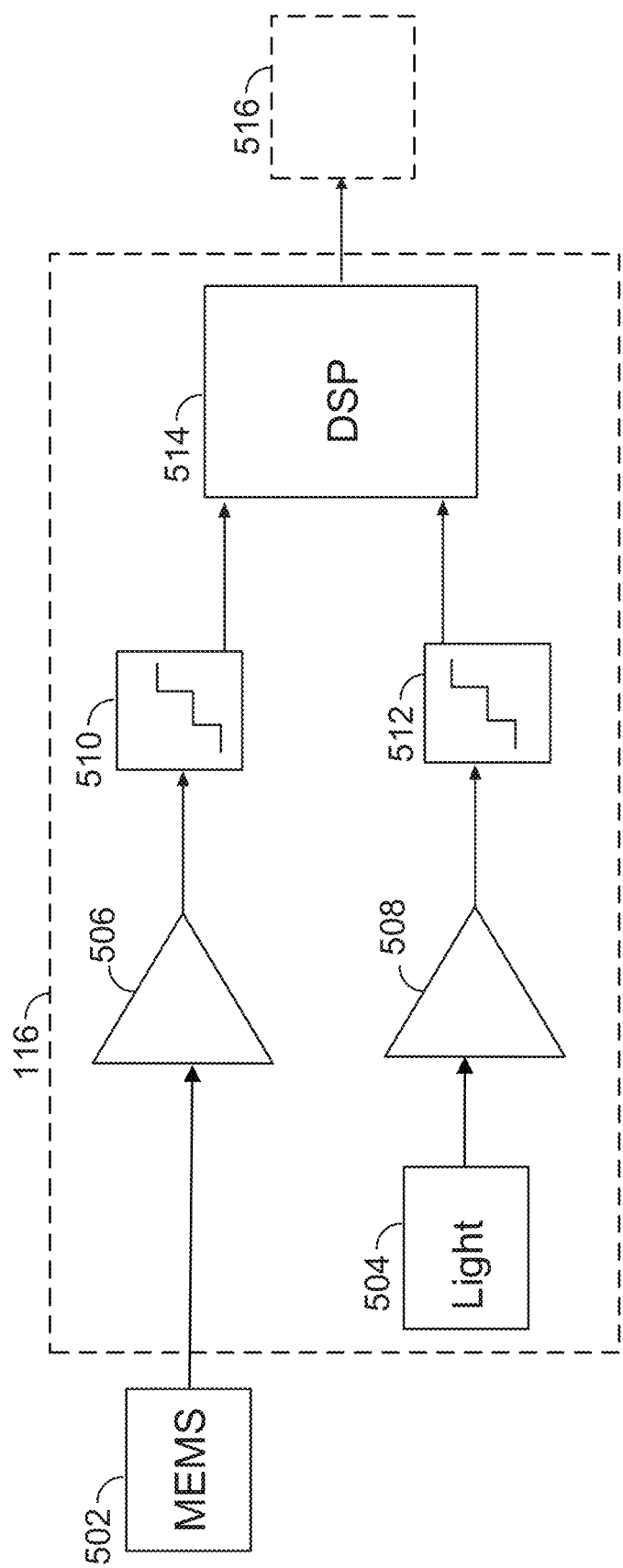
FIG. 5 shows illustrative processing circuitry of a MEMS microphone in accordance with an embodiment of the present disclosure.
Figure 6:
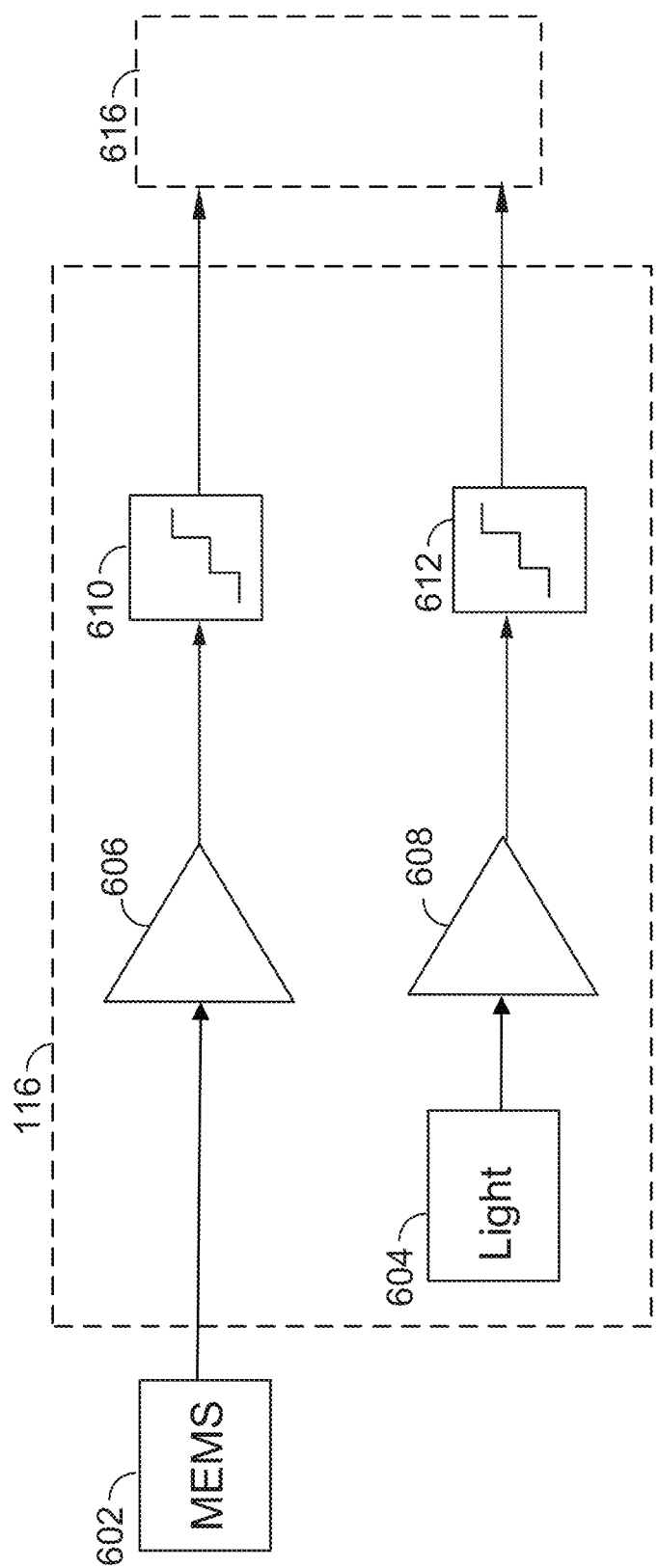
FIG. 6 shows illustrative processing circuitry of a MEMS microphone in accordance with an embodiment of the present disclosure.
Figure 7:
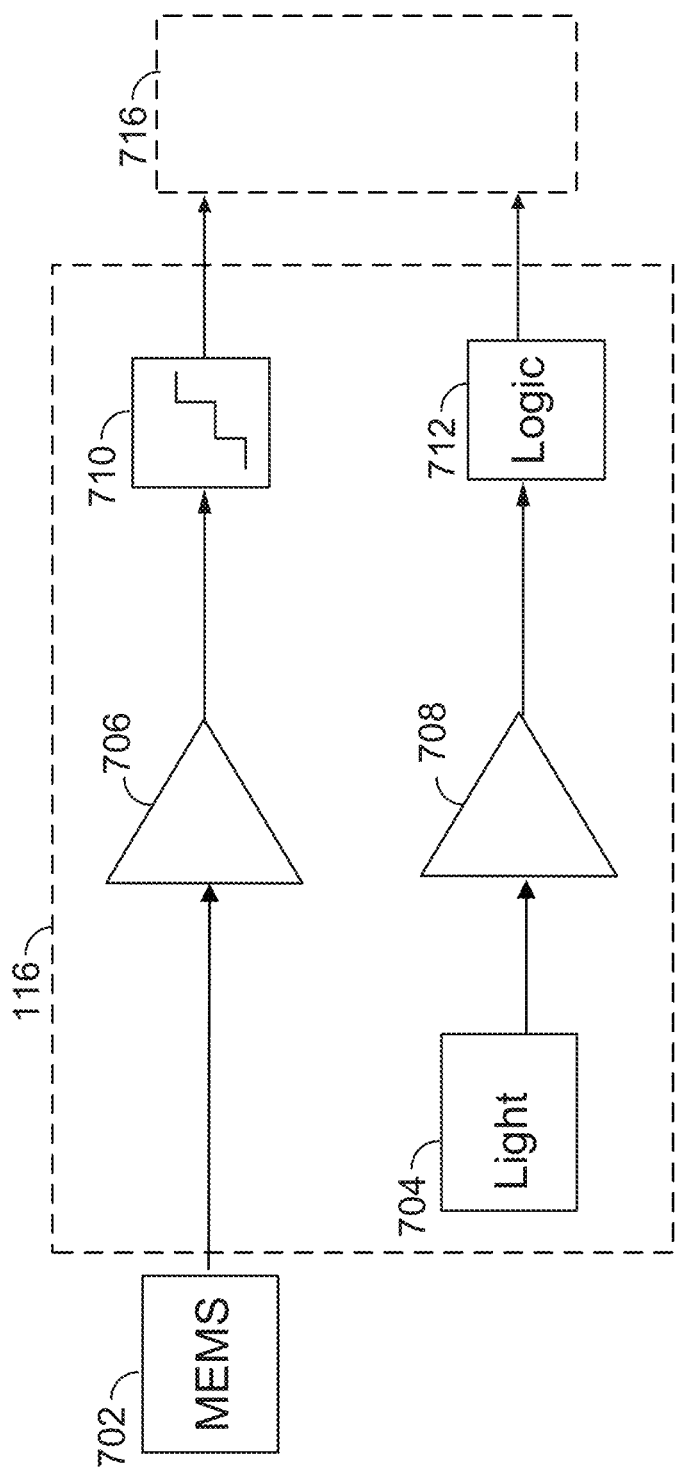
FIG. 7 shows illustrative processing circuitry of a MEMS microphone in accordance with an embodiment of the present disclosure.

FIGS. 5-7 shows illustrative processing circuitry 116 of a MEMS microphone in accordance with embodiments of the present disclosure. Although particular circuitry for performing particular operations is described as being included in the processing circuitry 116 of FIGS. 5-7, it will be understood that the processing circuitry 116 of a MEMS microphone package 100 includes additional circuitry for various functions such as power management, communications, and the like, as described herein and as is known in the art. The components described in FIGS. 5-7 for processing circuitry 116 relate to operations for receiving and processing signals from light sensors and a capacitor of a MEMS microphone, and while particular operations are described in the context of FIGS. 5-7, it will be understood that additional operations for receiving and processing such signals (e.g., filtering, scaling, analog-digital conversion, amplification, etc.) may not be included in the below description for clarity.

FIG. 5 shows illustrative processing circuitry 116 of a MEMS microphone including MEMS microphone and light signal processing and an internal digital signal processor (DSP) 514 in accordance with some embodiments of the present disclosure. Although more than one MEMS microphone structure may provide signals to a single processing circuitry 116 in some embodiments, in the embodiment of FIG. 5 a MEMS microphone structure 502 (e.g. a capacitor formed by MEMS diaphragm 112 and back plate 114) outputs a signal based on movement of the MEMS diaphragm in response to the received acoustic signal, but which may also include a portion of the signal that corresponds to light-induced noise as described herein. This signal is received by the processing circuitry 116 and is processed by amplifier 506 to generate a microphone signal and analog-to-digital (A/D) converter 510 to digitize the microphone signal, before being provided to DSP 514 for additional processing. The components of the processing circuitry 116 such as an amplifier 506 or A/D converter 510 may also be affected by light-induced noise, such that additional light-induced noise is added to the MEMS signal by the processing circuitry 116.

Although light sensors may be located in a variety of locations as described herein, and in some embodiments, multiple light sensor outputs may be processed simultaneously, in the embodiment of FIG. 5 a light sensor 504 is a component of processing circuitry 116 and outputs a light signal to amplifier 508, which in turn provides the amplified light signal to A/D converter 512. The gain of the amplifier 508 may be adjustable and controlled by the DSP 514 for more optimal signal processing. The gain the amplifier of the 508 may also be calibrated to the match the light sensitivity of the acoustical signal path (502, 506, 510) such that output magnitude of the A/D converter 512 is identical to the magnitude of the light signal present in the output of acoustical signal-path A/D converter 510. The time base for transitions of the A/D converters 510 and 512 are coordinated, such that the timing of the digital representation of the microphone signal (e.g., from A/D converter 510) corresponds to the timing of the digital representation of the light signal (e.g., from A/D converter 512). Accordingly, the DSP 514 may receive time-aligned digital representations of the microphone signal and the light signal for analysis and process these signals as described herein. For example, the DSP 514 may establish a baseline while there is an active MEMS microphone signal and the light signal is below a threshold, indicating normal sensor operation, or in some embodiments, this information may be provided beforehand. The DSP 514 may also establish a baseline relationship between the received light signal and the received microphone signal, for example, based on correlation or spectral analysis of the signals. These baselines may be performed in real time based on data received during MEMS microphone operation and/or based on a test routine.

The DSP 514 may provide real-time analysis of the received light signal. An example of a simple DSP operation is to subtract the signal received from the A/D converter 512 from the acoustical signal-path A/D converter 510. DSP 514 may also compare the light signal to absolute thresholds and/or cumulative thresholds (e.g., to compare a total amount of light energy received over a time period to a threshold that corresponds to heating or other change in MEMS and/or processing circuitry operation) and generate messages or warnings for transmission to external circuitry such as host processor 516, which in turn can take corrective action such as reducing a confidence level for analysis of received microphone signals (e.g., by increasing accuracy thresholds for recognizing speech from a particular individual), reducing signal gain of the acoustical signal path, providing messages to a user, or taking other corrective action (e.g., temporarily blocking the access port to test whether the change in signal is due to light interference, and communicating this to the DSP 514 for analysis of subsequently received light signals and microphone signals).

In some embodiments, pattern analysis may be employed (e.g. speech or voice pattern) to identify known light interference patterns, such as travelling past light obstructions at high speed, hacking attempts, and the like. Depending on the identified light interference pattern, signal compensation techniques may be selected for the received microphone signal, the host processor 516 may modify its comparison thresholds (e.g., for speech), and/or countermeasures may be employed in the instance of a hacking attempt (e.g., recording the received light pattern, capturing images and/or other information about the current use circumstance, or alerting other devices or third parties about the hacking attempt). In some embodiments, one or more frequencies associated with the received light signal may be identified, such that those frequencies can be filtered from the microphone signal to improve the fidelity of the acoustical signal. If the identified light interference pattern is classified as human voice or speech, the acoustical sensitivity of the microphone may be reduced or the user may be prompted to take action such as repeating the voice command at higher volume or in closer proximity to the microphone. If the DSP discriminates the signal pattern from A/D converter 510 as similar to A/D converter 512, it may block the output of the microphone or take other action to prevent tampering attempt.

DSP 514 may also modify the microphone signal locally at the processing device 116 of the MEMS microphone, such that any compensation of the microphone signal due to light interference is transparent to the host processor 516. As described herein, an association between a received light signal value and/or pattern and the raw MEMS microphone signal (e.g., the output of A/D converter 510 prior to compensation) may be known or determined, such that the MEMS microphone signal is modified in real-time based on the light signal. In some embodiments, more complex modifications may be performed on the MEMS microphone signal based on light signal patterns, such as filtering of frequencies associated with the light signal or selectively removing the spectral patterns form the MEMS microphone signal.

DSP 514 may also modify the operation of the MEMS microphone (e.g., based on communication with other processing circuitry 116, not depicted) to ameliorate the impact of light interference on the MEMS microphone. For example, operating voltages of the active MEMS components forming the capacitor (e.g., MEMS diaphragm 112 and back plate 114) may be temporarily modified (e.g., decreased) to temporarily improve the resilience of the operational MEMS components to light interference without significantly impacting long-term power consumption In embodiments with multiple MEMS microphone structures, the weighting for combination of microphone signals may be modified based on respective light impacts associated with each MEMS microphone structure. The processing circuitry can be calibrated based on its corresponding light signal sensitivity wherein the DSP was able to correctly discriminate the light signal in the acoustical signal path.

FIG. 6 shows illustrative processing circuitry of a MEMS microphone in accordance with an embodiment of the present disclosure. Similarly numbered components of FIG. 5 and FIG. 6 perform similar functionality. In the embodiment of FIG. 6, the DSP functionality is not performed at the processing circuitry 116, but instead is performed external to the processing circuitry such as at a DSP of a host processor 616. Performing the DSP functionality at a host processor reduces power consumption of the local processing unit 116 of the MEMS microphone, while allowing existing DSP hardware and software to perform more complex functions such as pattern analysis, compensation, test routine execution, and other complex operations as described herein. The digitized microphone signal from A/D converter 610 and the digitized light signal 612 may be provided to the host processor 616 as time-aligned digital data, with a sufficient time and amplitude resolution for the DSP of the host processor to perform required analysis.

FIG. 7 shows illustrative processing circuitry of a MEMS microphone in accordance with an embodiment of the present disclosure. Similarly numbered components of FIG. 6 and FIG. 7 perform similar functionality. In the embodiment of FIG. 7, in addition to the DSP function being offloaded from the processing circuitry 116, the A/D converter of the light signal path is replaced with logic 712. In this manner, light signal processing is less operation-intensive than other embodiments, further simplifying the required additional hardware and/or software of processing circuitry 116 necessary to process light interference information. Logic 712 may analyze the amplified light signal from amplifier 708 in a simplified manner, for example, by comparison to one or more thresholds for absolute values and/or rate-of-change of absolute values. In an embodiment with multiple thresholds (e.g., multiple levels of thresholds and/or absolute and rate-of-change thresholds), different thresholds may correspond to different output data to be provided to the host processor, such as warnings regarding signal accuracy or critical warnings corresponding to compromised microphone operation or hacking attempts.

Figure 8:
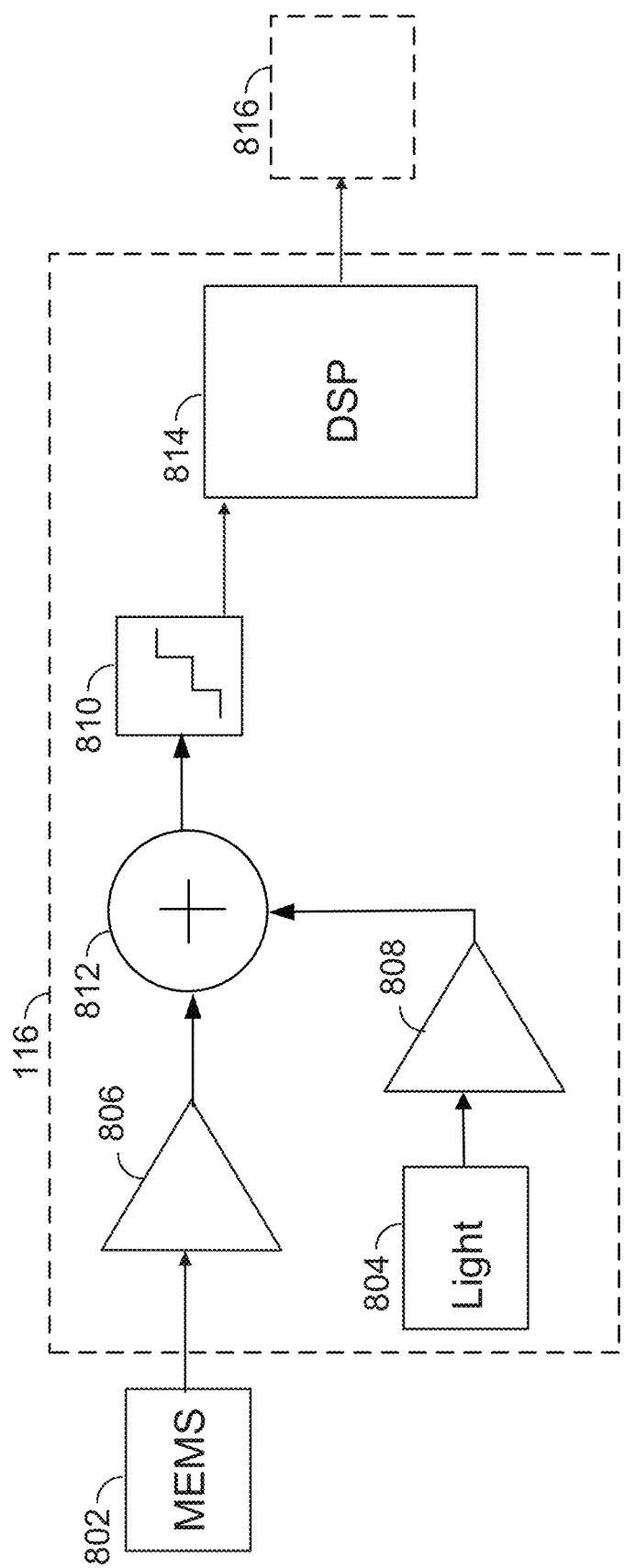
FIG. 8 shows illustrative processing circuitry of a MEMS microphone in accordance with an embodiment of the present disclosure.

FIG. 8 shows illustrative processing circuitry of a MEMS microphone in accordance with an embodiment of the present disclosure. Similarly numbered components of FIG. 8 and FIG. 5 perform similar functionality. In the embodiment of FIG. 8, the light signal is removed from the microphone signal in the analog domain. The amplifier 806 and amplifier 808 are selected (e.g., based on measurements performed using test circuitry as described herein) such that the scaling of the amplification of the light portion of the received signal from MEMS 802 and the signal from light sensor 804 are matched at the outputs of the respective amplifiers 806 and 808. In this manner, the analog output of the amplifier 808 can be used to remove the light signal portion of the analog output of amplifier 806, such as by subtraction at adder 812. In other embodiments, the amplifiers 806 and 808 may be selected differently such that other analog processing operations (e.g., filtering) can be performed rather than analog subtraction. Once the light signal has been used to modify the microphone signal in the analog domain, processing may continue as described herein, for example, by digitizing the modified microphone signal at A/D converter 810 and processing the modified microphone signal by other circuitry such as an on-circuit DSP 814 and/or external processing circuitry (not depicted in FIG. 8).

Figure 9:
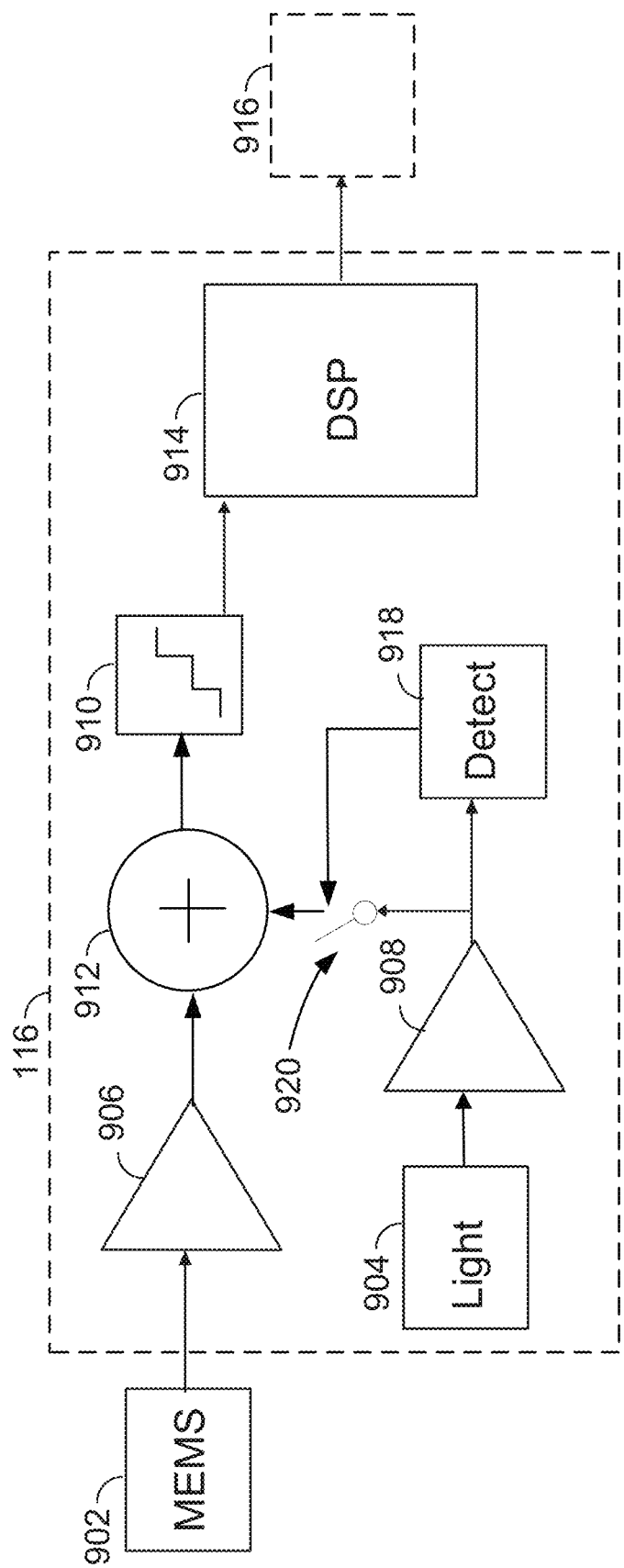
FIG. 9 shows illustrative processing circuitry of a MEMS microphone in accordance with an embodiment of the present disclosure.

FIG. 9 shows illustrative processing circuitry of a MEMS microphone in accordance with an embodiment of the present disclosure. Similarly numbered components of FIG. 9 and FIG. 8 perform similar functionality. In the embodiment of FIG. 9, light detection circuitry 918 and a switch 920 may be added to the signal path of the light signal to selectively provide the light signal to modify the microphone signal. Light detection circuitry 918 (e.g., a comparator) may determine whether the light signal output from amplifier 908 meets certain criteria (e.g., exceeds a threshold). If the criteria is not met, this may be indicative that the light signal is not of a type that is likely to interfere with the microphone signal, such that modification of the microphone signal may be counterproductive (e.g., by lowering the accuracy of the microphone signal for low volume content). If the criteria is met, the light detection circuitry 918 may cause the amplified light signal from amplifier 908 to modify the microphone output of amplifier 906 in the analog domain, such as by changing the state of switch 920. At appropriate times, the analog output of the amplifier 908 can be used to remove the light signal portion of the analog output of amplifier 906, such as by subtraction at adder 912. In other embodiments, the amplifiers 906 and 908 may be selected differently such that other analog processing operations (e.g., filtering) can be performed rather than analog subtraction. Processing may continue as described herein, for example, by digitizing the modified microphone signal at A/D converter 910 and processing the modified microphone signal by other circuitry such as an on-circuit DSP 914 and/or external processing circuitry (not depicted in FIG. 9).

Figure 10:
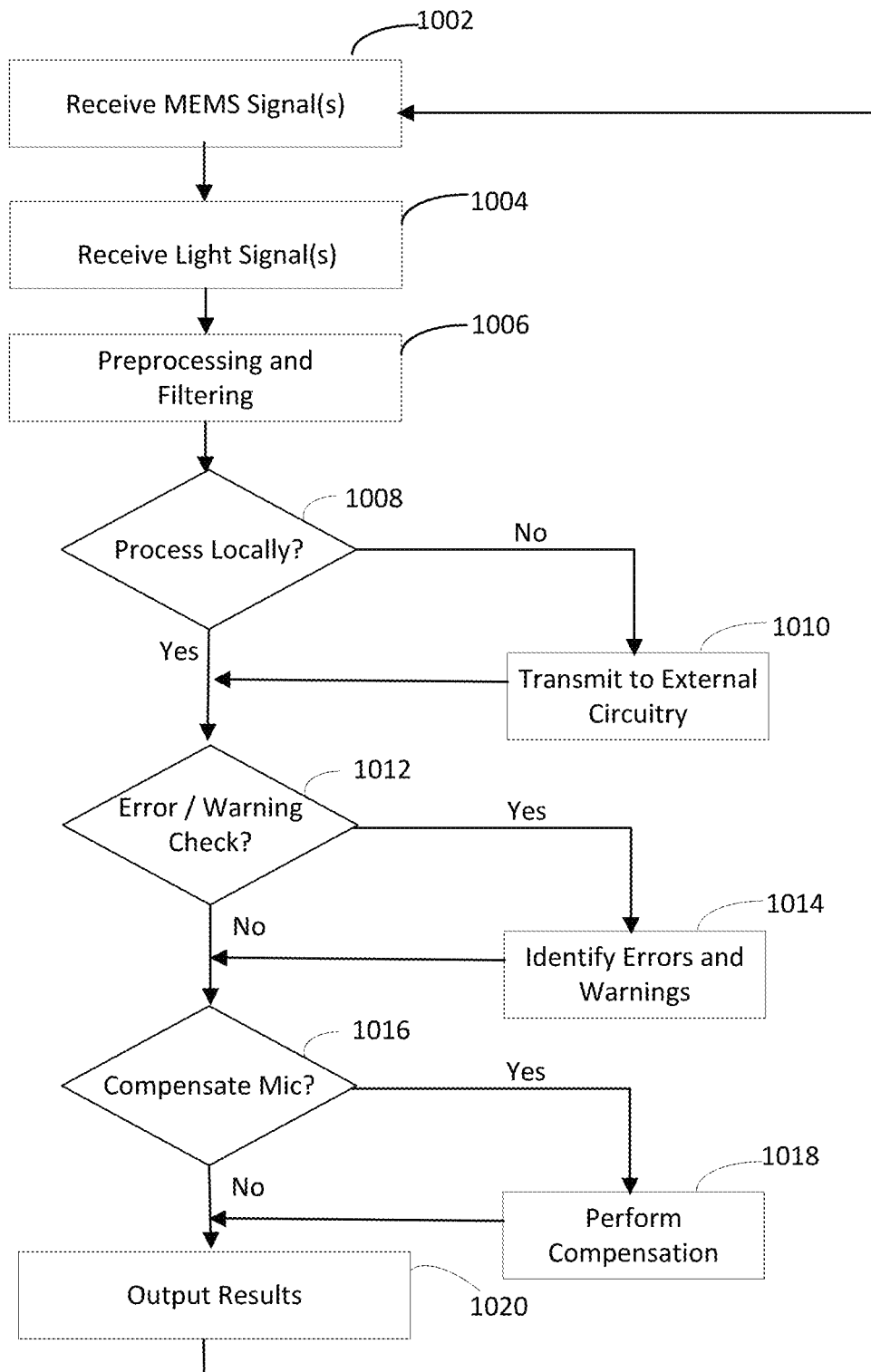
FIG. 10 depicts an illustrative flowchart of a process for operating a MEMS microphone based on a light signal in accordance with some embodiments of the present disclosure.

FIG. 10 depicts an illustrative flowchart of a process for operating a MEMS microphone based on a light signal in accordance with some embodiments of the present disclosure. Although a particular set of steps is depicted in a particular sequence in FIG. 10, it will be understood that one or more steps may be added or omitted and that the sequences of steps may be modified. Although the steps of FIG. 10 may be described within the context of the MEMS microphone packages and light sensors depicted and described in FIGS. 3-7 herein, it will be understood that the present steps apply to other types of microphones that experience light interference such as through an access port, and to other MEMS microphone designs (e.g., a different MEMS handle structure, front cavity, back cavity, ASIC, cover, and access port designs) and configurations (e.g., an array of microphones or multiple microphones) as well as other light sensor designs and configurations (e.g., at different locations within and/or external to the MEMS microphone package).

At step 1002, processing circuitry 116 (e.g., an ASIC located within a back cavity 126 of a MEMS microphone package 100) receives a signal from each of one or more MEMS handle structures (e.g., a signal received via electrical connection 122 that is representative of a capacitance between a MEMS diaphragm 112 and back plate 114 of a MEMS handle structure 110). This received MEMS signal changes based on a received acoustical signal (e.g., acoustical signal 108) causing movement within the MEMS handle structure (e.g., causing movement of the MEMS diaphragm 112 relative to back plate 114, changing the capacitance of the capacitor between diaphragm 112 and back plate 114). The received MEMS signal may also be impacted (e.g., within the MEMS handle structure and/or within a signal path of the processing circuitry 116) by a light interference source (e.g., from light interference source 130 propagating through the front cavity 124, MEMS handle structure 110, and back cavity 126), as described herein. Once the MEMS signal is received, processing may continue to step 1004.

At step 1004, processing circuitry 116 receives light signals from one or more light sensors, such as light sensors 132a/132b/132c/132d/132e/132f/132g/132h. As described herein, light sensors may be located at distributed about multiple locations, including locations external to the MEMS microphone package, on external cover or substrate surfaces of the MEMS microphone package, within an access port of the MEMS microphone package, within a front cavity of the MEMS microphone package, in the MEMS handle structure of the MEMS microphone package, within a back cavity of the MEMS microphone package, and on the processing circuitry 116. The light signals from the light sensors are received by the processing circuitry, either directly from the light sensors for light sensor integrated with the processing circuitry, or via electrical connections to lights sensors. Once the light signals are received, processing may continue to step 1006.

At step 1006, processing circuitry 116 performs preprocessing and filtering of the received MEMS signal(s) and light signal(s). Each of the signals may be independently amplified to provide an electrical signal (e.g., output voltage and/or current) that is suitably robust and scaled for additional processing. In some embodiments, filtering may be independently applied to each of the MEMS signal(s) and light signal(s), for example, to remove known noise signals or to focus on particular bandwidths of interest for further analysis. The resulting microphone signal(s) and light signal(s) may also be independently converted into respective digital signals by an A/D converter. Additional preprocessing, scaling and filtering may also be performed in some embodiments. Once preprocessing and filtering are complete, processing may continue to step 1008.

At step 1008, processing circuitry 116 determines whether processing of the microphone signal in view of the light signal is to be performed at the processing circuitry 116 of the MEMS microphone or at external processing circuitry such as a host processor. In some embodiments, the processed microphone signal(s) and light signal(s) or digital versions thereof are analyzed by the processing circuitry 116 (e.g., by a DSP of the processing circuitry) while in other embodiments some or all of this processing is performed by a host processor. If some or all of the processing is to be performed by external processing circuitry, the relevant data (e.g., time-associated digital versions of the microphone signal(s) and light signal(s)) may be transmitted to the external processing circuitry at step 1010. Processing then continues from step 1008 or step 1010 to step 1012.

At step 1012, processing circuitry 116 and/or external processing circuitry (e.g., an external host processor) determines whether to perform error and warning check operations. Depending on the particular application and available processing, error and warning checks may be performed as the primary analysis of light signal(s) as described in FIG. 7 in some embodiments. In other embodiments, error and warning checks may be performed along with other operations, such as compensation of the microphone signal(s)

based on the light signal(s). If error and warning check operations are to be performed, processing may continue to step 1014. If error and warning check operations are not performed, processing may continue to step 1016.

At step 1014, processing circuitry 116 and/or external processing circuitry (e.g., an external host processor) perform error and warning checks. As described herein, error and warning checks may analyze the light signal(s), and in some embodiments also analyze the microphone signal (e.g., by correlating a change in noise on the microphone signal(s) to a change in the light signal(s)), to generate errors and warnings that may be used for a variety of purposes as described herein, such as selecting methodologies used for microphone signal(s) analysis, adjusting confidence level requirements for voice and speech analysis, provide instructions to the user or other systems to mitigate the light interference, and taking evasive actions to mitigate hack attempts. Once any errors or warnings are generated, processing may continue to step 1016.

At step 1016, processing circuitry 116 and/or external processing circuitry (e.g., an external host processor) determines whether to perform modify the microphone signal(s) by performing compensation. Depending on the particular application and available processing, the light signal(s) may be used to modify the microphone signal(s) in real-time (e.g., at the processing circuitry as described for FIG. 4 or at an external processor such as a host processor as described for FIG. 5) such that other applications receive a microphone signal(s) that accurately captures the underlying acoustic signal despite the presence of light interference. If compensation of the microphone signal is to be performed, processing may continue to step 1018. If compensation of the microphone signal is not to be performed, processing may continue to step 1020.

At step 1018, processing circuitry 116 and/or external processing circuitry (e.g., an external host processor) may compensate the microphone signal(s) based on the light signal(s). As described herein, compensation may be performed in a variety of manners. In an exemplary embodiment of correlation analysis, changes in the level of the microphone signal may be associated with changes in noise present in the microphone signal, such that the noise can be removed from the signal and/or other measures can be taken to temporarily increase the signal-to-noise ratio (e.g., increasing amplification, modifying operating voltages of the MEMS handle structure, etc.). In an exemplary embodiment of frequency analysis, a frequency associated light interference may be determined (e.g., by spectral analysis) and band-pass filtering or other similar methods may be employed to remove the light interference from the microphone signal(s). In an exemplary embodiment of pattern analysis, once a sufficient sampling of a light interference source is received the light interference may be determined to be from a particular source or of a particular type (e.g., natural light, artificial light, directed light, travel past obstructions, intentional hacking, etc.) and particular compensation techniques may be selected (e.g., combining correlation and frequency techniques). Once the microphone signal(s) compensation is complete, processing may continue to step 1020.

At step 1020, processing circuitry 116 and/or external processing circuitry (e.g., an external host processor) may output the results. Results may be output to other programs or circuitry (e.g., of processing circuitry 116 or of an external host processor), such as by providing a stream of compensated digital microphone data and appropriate warnings and errors to a program such as a telephone application, videoconferencing application, speech recognition application, voice command application, or any other program that uses microphone information. Once the microphone data, warnings, errors, and any other information have been output, processing may return to step 1002 to continue receiving MEMS signal(s) and light signal(s).

The foregoing description includes exemplary embodiments in accordance with the present disclosure. These examples are provided for purposes of illustration only, and not for purposes of limitation. It will be understood that the present disclosure may be implemented in forms different from those explicitly described and depicted herein and that various modifications, optimizations, and variations may be implemented by a person of ordinary skill in the present art, consistent with the following claims.

What is claimed is:

1. A microelectromechanical system (MEMS) package, comprising:
a MEMS microphone configured to output an acoustic signal and defining a front cavity and a back cavity;
a light sensor at a location within the back cavity of the MEMS package and configured to output a light signal based on light received at the location; and
processing circuitry coupled to receive the microphone signal and the light signal, wherein the processing circuitry is configured to output a microphone output signal corresponding to the acoustic signal and a light output signal based on the light signal.

2. The MEMS microphone package of claim 1, wherein the processing circuitry is configured to output the microphone output signal and the light output signal to an external device.

3. The MEMS microphone package of claim 1, wherein the light sensor resides on an exposed surface of the processing circuitry.

4. The MEMS microphone package of claim 3, further comprising a shielding layer covering a portion of the processing circuitry within the back cavity, wherein a gap in the shielding layer reveals the light sensor and the exposed surface of the processing circuitry to the back cavity.

5. The MEMS microphone package of claim 3, further comprising a substrate located between the processing circuitry and an exterior volume to the MEMS microphone package, wherein a through hole of the substrate exposes the light sensor to the exterior volume.

6. The MEMS microphone package of claim 3, wherein the light sensor comprises a first light sensor, wherein the location comprises a first location on a first exposed surface of the processing circuitry within the back cavity, and wherein the light signal comprises a first light signal, further comprising:
a second light sensor at a second location on a second exposed surface of the processing circuitry within the back cavity and configured to output a second light signal based on light received at the second location, wherein the light output signal is based on the first light signal and the second light signal.

7. The MEMS microphone package of claim 1, wherein the light sensor resides on an upper exposed surface of a substrate within the back cavity.

8. The MEMS microphone package of claim 1, wherein the processing circuitry is configured to modify the microphone signal based on the light signal to generate the microphone output signal.

9. The MEMS microphone package of claim 8, wherein the processing circuitry further comprises a switch, and wherein the switch selectively provides the light signal to modify the microphone signal for generation of the microphone output signal.

10. The MEMS microphone package of claim 8, wherein the modification of the microphone signal by the light signal comprises one of correlation analysis, frequency analysis, or pattern analysis.

11. The MEMS microphone package of claim 1, wherein the processing circuitry is configured to analyze the light signal and the microphone signal by correlating a change in noise of the light signal to a change in noise of the microphone signal.

12. The MEMS microphone package of claim 1, wherein the processing circuitry is configured to perform error or warning checks by analyzing the light signal and the microphone signal by correlating a change in noise of the light signal to a change in noise of the microphone signal.

13. The MEMS microphone package of claim 1, wherein the processing circuitry is configured to analyze the light signal and the microphone signal by correlating a change in noise of the light signal to a change in noise of the microphone signal and adjust parameters for voice or speech analysis.

14. The MEMS microphone package of claim 1, wherein the front cavity includes a receiving volume for the received acoustic signal to be provided to the MEMS diaphragm.

15. The MEMS microphone package of claim 1, wherein the light output signal and the microphone output signal are provided to an external device, and wherein the external device is configured to modify the microphone output signal based on the light output signal to remove a contribution of the light signal to the microphone signal based on the light output signal.

16. The MEMS microphone package of claim 1, wherein the processing circuitry comprises a microphone signal path and a light signal path, comprising:
 a first amplifier, of the microphone signal path, coupled to receive the microphone signal;
 an analog-to-digital converter of the microphone signal path coupled to receive an output of the first amplifier and to output a digitized version as the microphone output signal;
 a second amplifier, of the light signal path, coupled to receive the light signal; and
 an analog-to-digital converter of the light signal path coupled to receive an output of the second amplifier and to output a digitized version as the light output signal.

17. A method for operating a microelectromechanical system (MEMS) microphone package, comprising:
 receiving, at a MEMS device, a received acoustic signal;
 generating, by a MEMS microphone of the MEMS device, a microphone signal representative of the received acoustic signal, wherein the MEMS microphone defines a front cavity and a back cavity;
 receiving light at a light sensor at a location within the back cavity of the MEMS microphone package;
 generating, by the light sensor, a light signal based on the light received at the location;
 receiving, by processing circuitry of the MEMS microphone package, the microphone signal and the light signal; and
 generating, by the processing circuitry of the MEMS microphone package, a microphone output signal corresponding to the microphone signal and a light output signal based on the light signal.

18. The method of claim 17, further comprising analyzing the light signal and the microphone signal by correlating a change in noise of the light signal to a change in noise of the microphone signal.

19. The method of claim 18, further comprising adjusting parameters for voice or speech analysis based on the analyzing.

20. The method of claim 17, further comprising modifying the microphone signal by the light signal based on one of correlation analysis, frequency analysis, or pattern analysis.

* * * * *